(12) United States Patent
Fujimoto

(10) Patent No.: US 8,013,497 B2
(45) Date of Patent: Sep. 6, 2011

(54) PIEZOELECTRIC POWER GENERATOR

(75) Inventor: Katsumi Fujimoto, Nagaokakyo (JP)

(73) Assignee: Murata Manufacturing Co., Ltd., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 13/036,353

(22) Filed: Feb. 28, 2011

(65) Prior Publication Data

US 2011/0148256 A1 Jun. 23, 2011

Related U.S. Application Data

(63) Continuation of application No. PCT/JP2009/004383, filed on Sep. 4, 2009.

(30) Foreign Application Priority Data

Sep. 9, 2008 (JP) .................................. 2008-231091

(51) Int. Cl.
*H01L 41/08* (2006.01)
(52) U.S. Cl. ...................................................... 310/339
(58) Field of Classification Search .................. 310/338, 310/339, 329, 348, 311, 355, 354; 73/146.5, 73/146.6; *H01L 41/08, 41/113, 41/103*
See application file for complete search history.

(56) References Cited

U.S. PATENT DOCUMENTS

| 4,712,036 | A | * | 12/1987 | Gurich | ........................... | 310/338 |
| 7,504,763 | B2 | * | 3/2009 | Haswell et al. | ............... | 310/339 |

FOREIGN PATENT DOCUMENTS

| JP | 10-174462 | A | 6/1998 |
| JP | 2003-348863 | A | 12/2003 |
| JP | 2007-281015 | B1 | 7/2007 |
| JP | 2008-192944 | A | 8/2008 |
| JP | 2008-67451 | A | 10/2009 |

OTHER PUBLICATIONS

PCT/JP2009/004383 International Search Report dated Oct. 23, 2009.
PCT/JP2009/004383 Written Opinion dated Oct. 23, 2009.

* cited by examiner

*Primary Examiner* — Alter Benson
*Assistant Examiner* — Karen B Addison
(74) *Attorney, Agent, or Firm* — Dickstein Shapiro LLP

(57) ABSTRACT

A piezoelectric power generator that includes a support body, a piezoelectric element, and a bias compressive stress applying member. The piezoelectric element is placed on the support body. The piezoelectric element has a piezoelectric plate that is polarized in the thickness direction, and first and second electrodes that are each provided on a surface of the piezoelectric plate. The bias compressive stress applying member is supported on the side above the piezoelectric element by the support body. The bias compressive stress applying member applies to the piezoelectric element a bias compressive stress acting in the thickness direction of the piezoelectric plate, so that the magnitude of a compressive stress in the piezoelectric plate changes with a change in externally applied stress.

15 Claims, 4 Drawing Sheets

PIEZOELECTRIC POWER GENERATOR

CROSS REFERENCE TO RELATED APPLICATIONS

The present application is a continuation of International Application No. PCT/JP2009/004383, filed Sep. 4, 2009, which claims priority to Japanese Patent Application No. JP2008-231091, filed Sep. 9, 2008, the entire contents of each of these applications being incorporated herein by reference in their entirety.

FIELD OF THE INVENTION

The present invention relates to a piezoelectric power generator, and more specifically to a piezoelectric power generator which is mounted to, for example, an automobile or the tires of an automobile, vibrates upon application of acceleration or distortion, and generates electric power due to the piezoelectric effect.

BACKGROUND OF THE INVENTION

In the related art, piezoelectric power generators are known which vibrate upon application of acceleration, distortion, or the like, and generate electric power due to the piezoelectric effect. Using these piezoelectric power generators as power supplies eliminates the need for another power supply such as a battery. Accordingly, the above-mentioned piezoelectric power generators are suitably used as power supplies of various sensors, or the like for use in applications where vibration or distortion is applied.

An example of the above-mentioned piezoelectric power generators is disclosed in PTL 1 mentioned below. FIG. 9 is a perspective view showing a piezoelectric power generator described in PTL 1. As shown in FIG. 9, a piezoelectric power generator 100 has a piezoelectric vibrator 101. The piezoelectric vibrator 101 has a metal plate 102, and piezoelectric plates 103 and 104 bonded to both principal surfaces of the metal plate 102. The proximal end of the piezoelectric vibrator 101 is fixed to a stationary plate 105. A weight 106 is mounted to the distal end of the piezoelectric vibrator 101.

In the piezoelectric power generator 100 described in PTL 1 mentioned above, when the piezoelectric power generator 100 is subjected to acceleration, distortion, or the like, the piezoelectric vibrator 101 vibrates, and electric power is generated due to the piezoelectric effect. Consequently, as the piezoelectric vibrator 101 vibrates, a compressive stress and a tensile stress are alternately exerted on the piezoelectric plates 103 and 104.

PTL 1: Japanese Unexamined Patent Application Publication No. 10-174462

SUMMARY OF THE INVENTION

However, generally, a piezoelectric plate has such a characteristic that its rigidity to tensile stress is lower than that to compressive stress. For this reason, the piezoelectric power generator 100 whose piezoelectric plates 103 and 104 are subjected to tensile stress has a problem in that cracking is prone to occur in the piezoelectric plates 103 and 104. Therefore, the piezoelectric plates 103 and 104 are prone to breakage when used over time, leading to low durability of the piezoelectric power generator 100.

An object of the present invention is to provide a piezoelectric power generator whose piezoelectric plate is resistant to cracking, and which has high durability.

A piezoelectric power generator according to the present invention includes a support body, a piezoelectric element, and a bias compressive stress applying member. The piezoelectric element is placed on the support body. The piezoelectric element has a piezoelectric plate that is polarized in the thickness direction, and first and second electrodes that are each provided on a surface of the piezoelectric plate. The bias compressive stress applying member is supported on the side above the piezoelectric element by the support body. The bias compressive stress applying member applies to the piezoelectric element a bias compressive stress acting in the thickness direction of the piezoelectric plate, so that the magnitude of a compressive stress in the piezoelectric plate changes with a change in externally applied stress.

In a specific aspect of the present invention, the support body is formed by an elastic body. In this configuration, as the support body undergoes elastic deformation upon application of an external stress, the magnitude of a bias compressive stress applied to the piezoelectric element by the bias compressive stress applying member changes. Consequently, a change in the external stress is efficiently transmitted to the piezoelectric element. Therefore, power generation efficiency can be enhanced.

In another specific aspect of the present invention, the bias compressive stress applying member is formed by a spring.

In a different specific aspect of the present invention, the bias compressive stress applying member is formed by a plate spring, and both ends of the plate spring in a first direction along a plane direction of the plate spring are supported by the support body. This configuration is particularly effective for cases in which the magnitude of an external stress changes only in the first direction.

In still another specific aspect of the present invention, both ends of the plate spring in a second direction along the plane direction of the plate spring are further supported by the support body. This configuration is particularly effective for cases in which the magnitude of an external stress changes in both the first direction and the second direction.

In a still different specific aspect of the present invention, the support body is formed by an elastic body, and has a support portion that supports the piezoelectric element, and a leg portion that extends to a side opposite to the piezoelectric element from each of both ends along a second direction of the support portion, the leg portion being fixed to a target mounting member to which the piezoelectric power generator is mounted. According to this configuration, deformation of the target mounting member in the second direction is absorbed by elastic deformation of the leg portion. Consequently, only deformation of the target mounting member in the first direction is transmitted to the base portion 11. Therefore, anisotropy of variation of the compressive stress in the piezoelectric plate can be increased.

In yet another specific aspect of the present invention, the second direction is perpendicular to the first direction.

In a yet different specific aspect of the present invention, the piezoelectric power generator includes a piezoelectric vibrator of a unimorph type having an elastic plate, the elastic plate having first and second principal surfaces that are opposite to each other and having the piezoelectric element bonded to only the first principal surface, and the support body supports the elastic plate side of a peripheral edge of the piezoelectric vibrator, so that a center portion of the piezoelectric vibrator is separated from the support body. According to this configuration, the magnitude of a compressive stress applied to the piezoelectric plate can be varied more greatly. Therefore, power generation efficiency can be enhanced.

In still yet another specific aspect of the present invention, the bias compressive stress applying member applies the bias compressive stress to a portion of the piezoelectric vibrator located closer to the center than a portion supported by the support body.

In still yet another specific aspect of the present invention, a plane shape of the piezoelectric plate is circular. According to this configuration, the efficiency of vibration of the piezoelectric element can be enhanced, thereby making it possible to attain high power generation efficiency.

In a yet still different specific aspect of the present invention, a plane shape of the elastic plate is circular. According to this configuration, the efficiency of vibration of the piezoelectric element can be enhanced, thereby making it possible to attain high power generation efficiency.

In still yet another specific aspect of the present invention, the piezoelectric power generator further includes a cushioning member placed at least one of between the support body and the piezoelectric element, and between the piezoelectric element and the bias compressive stress applying member. According to this configuration, a large stress is prevented from being exerted on the piezoelectric element, thereby effectively preventing the piezoelectric element from being damaged.

With the piezoelectric power generator according to the present invention, a bias compressive stress acting in the thickness direction of the piezoelectric plate is applied to the piezoelectric element by the bias compressive stress applying member, so that the magnitude of a compressive stress in the piezoelectric plate changes with a change in externally applied stress. Thus, a tensile stress is prevented from being produced in the piezoelectric plate, thereby making it possible to realize a piezoelectric power generator whose piezoelectric plate is resistant to cracking, and which has high durability.

DETAILED DESCRIPTION OF THE INVENTION

Hereinbelow, with reference to the drawings, the present invention will be clarified by describing specific embodiments of the present invention.

First Embodiment

In this embodiment, a description will be given of an example of a piezoelectric power generator which is suitable for use in cases in which the magnitude of an external stress exerted on the piezoelectric power generator changes only in a predetermined direction (the longitudinal direction Y in FIG. 1). Specifically, for example, the piezoelectric power generator according to this embodiment is used as the power supply of a pneumatic pressure sensor for a tire, or the like, with its surface on the Z1 side of a base portion 11 described later mounted to the inner surface of the tire.

Figure 1:
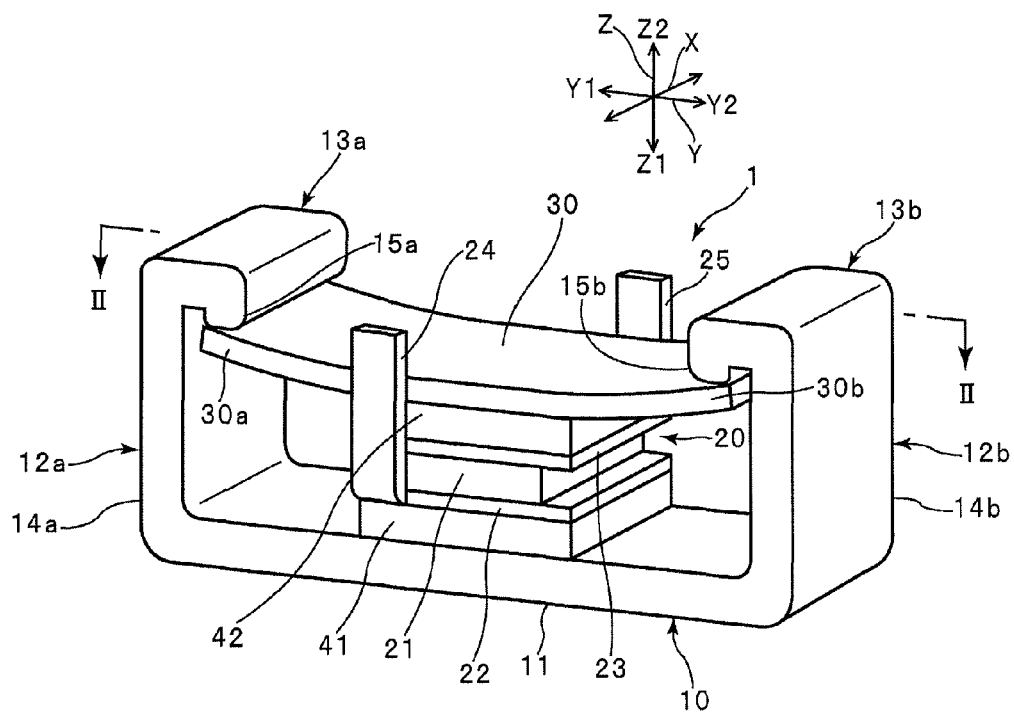
FIG. 1 is a schematic perspective view of a piezoelectric power generator according to a first embodiment as seen diagonally from the side.
Figure 2:
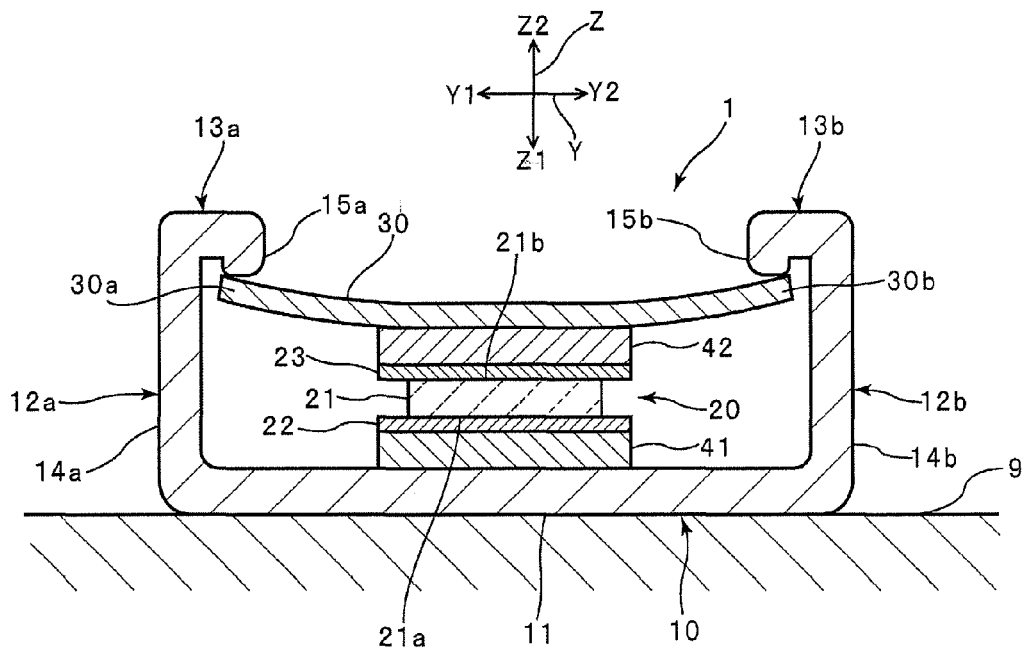
FIG. 2 is a schematic sectional view of the piezoelectric power generator taken along the sectioning line II-II shown in FIG. 1.

FIG. 1 is a schematic perspective view of a piezoelectric power generator according to a first embodiment as seen diagonally from the side. FIG. 2 is a schematic sectional view of the piezoelectric power generator taken along the sectioning line II-II shown in FIG. 1. As shown in FIGS. 1 and 2, a piezoelectric power generator 1 includes a support body 10, a piezoelectric element 20, a plate spring 30 as a bias compressive stress applying member, and first and second cushioning members 41 and 42.

The piezoelectric element 20 has a piezoelectric plate 21. The piezoelectric plate 21 is not particularly limited as long as the piezoelectric plate 21 produces a piezoelectric effect. The piezoelectric plate 21 may be made of, for example, a lead-zirconium-titanate piezoelectric ceramic.

The piezoelectric plate 21 is polarized in the thickness direction Z. As shown in FIG. 2, first and second electrodes 22 and 23 are respectively provided on first and second principal surfaces 21a and 21b of the piezoelectric plate 21. As shown in FIG. 1, first and second terminal electrodes 24 and 25 are respectively connected to the first and second electrodes 22 and 23. Electric power generated by the piezoelectric plate 21 is extracted from the first and second terminal electrodes 24 and 25.

The first and second electrodes 22 and 23, and the first and second terminal electrodes 24 and 25 can be formed of, for example, an appropriate conductive material such as Ag or Cu. For example, the first and second electrodes 22 and 23, and the first and second terminal electrodes 24 and 25 can be formed by coating/baking of a conductive metal paste such as Ag paste.

The piezoelectric element 20 and the plate spring 30 are supported by the support body 10. In this embodiment, the support body 10 is integrally formed of an elastic member such as a high-toughness, high-rigidity ceramic, plastic, or metal. In the case where the support body 10 is formed of a high-toughness, high-rigidity ceramic, and the first and second electrodes 22 and 23 are each formed of a conductive metal paste, it is preferable to perform firing of the support body 10, and baking of the conductive paste simultaneously.

The support body 10 includes the base portion 11 as a support portion, and first and second claw portions 12a and 12b. The base portion 11 is placed on the Z1 side in the thickness direction Z of the piezoelectric element 20. The piezoelectric element 20 is supported by the base portion 11. Also, the base portion 11 doubles as the mounting portion of the piezoelectric power generator 1. In other words, as shown in FIG. 2, the piezoelectric power generator 1 is mounted to a target mounting member 9 when its surface on the Z1 side of the base portion 11 is fixed to the target mounting member 9 such as a tire.

The first claw portion 12a is connected to an end on the Y1 side in the longitudinal direction Y of the base portion 11. On the other hand, the second claw portion 12b is connected to an end on the Y2 side in the longitudinal direction Y of the base portion 11. Each of the first and second claw portions 12a and 12b extends from the base portion 11 to the Z2 side in the thickness direction Z. In other words, in the thickness direction Z, each of the first and second claw portions 12a and 12b extends from the base portion 11 to the piezoelectric element 20 side.

The first and second claw portions 12a and 12b respectively include connecting portions 14a and 14b, and engaging portions 13a and 13b. The engaging portions 13a and 13b are respectively connected to the base portion 11 by the connecting portions 14a and 14b. The engaging portions 13a and 13b are respectively provided with projections 15a and 15b that project to the Z1 side. The projections 15a and 15b respectively support the Z2 side of both ends 30a and 30b of the plate spring 30 along the longitudinal direction Y that is a first direction.

As shown in FIG. 2, the plate spring 30 is supported by the support body 10 on the side Z2 above the piezoelectric element 20. The plate spring 30 is formed in an arcuate shape so as to be convex to the piezoelectric element side. The plate spring 30 applies to the piezoelectric plate 21 a stress (bias compressive stress) acting to the support body side Z1 in the thickness direction Z of the piezoelectric plate 21. Consequently, a compressive stress is exerted on the piezoelectric plate 21 in a state in which no stress is applied to the piezoelectric power generator 1.

More specifically, the plate spring 30 serving as a bias compressive stress applying member applies to the piezoelectric element 20 a bias compressive stress acting in the thickness direction Z of the piezoelectric plate 21, so that the magnitude of a compressive stress in the piezoelectric plate 21 changes with a change in stress externally applied to the piezoelectric power generator 1.

It should be noted that the plate spring 30 can be formed of, for example, a tough high-rigidity ceramic having a metal film formed on its surface, or a metal such as phosphor bronze or SUS (Stainless Used Steel).

In this embodiment, the first cushioning member 41 is placed between the support body 10 and the piezoelectric element 20, and the second cushioning member 42 is placed between the piezoelectric element 20 and the plate spring 30. The first and second cushioning members 41 and 42 are each formed by, for example, a PET sheet, a Teflon (registered trademark) sheet, a silicone rubber sheet, or a polyimide sheet.

Next, how electric power is generated in the piezoelectric power generator 1 will be described. As described above, in the state in which no stress is applied to the piezoelectric power generator 1, a bias compressive stress acting in the thickness direction Z of the piezoelectric plate 21 is applied to the piezoelectric element 20 by the plate spring 30. When the base portion 11 of the support body 10 deforms due to, for example, deformation of the target mounting member 9 shown in FIG. 2 by application of an external stress to the piezoelectric power generator 1, the urging force of the plate spring 30 changes, and the magnitude of a compressive stress in the piezoelectric plate 21 changes.

Specifically, when such a deformation occurs that both ends in the longitudinal direction Y of the base portion 11 are relatively displaced to the Z2 side with respect to the center portion, the first and second claw portions 12a and 12b are relatively displaced to the Z2 side with the deformation of the base portion 11. Consequently, the both ends 30a and 30b of the plate spring 30 are also relatively displaced to the Z2 side, and thus the urging force of the plate spring 30 becomes smaller. As a result, the compressive stress in the piezoelectric plate 21 becomes smaller.

Since the piezoelectric element 20 is sandwiched by the plate spring 30 and the support body 10, even when the urging force of the plate spring 30 becomes zero, practically no tensile stress is exerted on the piezoelectric plate 21.

On the other hand, when such a deformation occurs that both ends in the longitudinal direction Y of the base portion 11 are relatively displaced to the Z1 side with respect to the center portion, the first and second claw portions 12a and 12b are relatively displaced to the Z1 side with the deformation of the base portion 11. Consequently, the both ends 30a and 30b of the plate spring 30 are also relatively displaced to the Z1 side, and thus the urging force of the plate spring 30 becomes larger. As a result, the compressive stress in the piezoelectric plate 21 becomes larger.

In this way, the magnitude of the compressive stress in the piezoelectric plate 21 changes with a change in the urging force of the plate spring 30. Therefore, electric power is produced due to the piezoelectric effect.

As described above, in this embodiment, a bias compressive stress is applied to the piezoelectric plate 21 by the plate spring 30, thereby preventing a tensile stress from being exerted on the piezoelectric plate 21 which is weak in tensile stress. Therefore, it is possible to effectively prevent cracking from occurring in the piezoelectric plate 21. As a result, high durability can be achieved. From the viewpoint of achieving enhanced durability, it is preferable to mount the plate spring 30 to the support body 10 in such a way that a stress is constantly applied to the piezoelectric plate 21 by the plate spring 30.

In this embodiment, the support body 10 is formed by an elastic body. Thus, since vibration or deformation of the target mounting member 9 is efficiently transmitted to the piezoelectric element 20 via the support body 10, the magnitude of a compressive stress applied to the piezoelectric plate 21 can be varied more greatly. Therefore, power generation efficiency can be enhanced.

In this embodiment, the cushioning members 41 and 42 are placed between the support body 10 and the piezoelectric element 20, and between the piezoelectric element 20 and the plate spring 30, respectively. This prevents a large stress from being exerted on the piezoelectric element 20, thereby effectively preventing the piezoelectric element 20 from being damaged.

This embodiment is directed to the case in which the first electrode 22 is provided on the first principal surface 21a, and the second electrode 23 is provided on the second principal surface 21b. It should be noted, however, that in the present invention, the placement of the first and second electrodes 22 and 23 is not particularly limited as long as their location enables extraction of electric power from the piezoelectric plate 21. For example, both of the first and second electrodes 22 and 23 may be provided on one of the first and second principal surfaces 21a and 21b. In that case, it is preferable to further provide a counter electrode on the other one of the first and second principal surfaces 21a and 21b which is not provided with the first and second electrodes 22 and 23.

This embodiment is directed to the case in which a plate spring is used as a bias compressive stress applying member. It should be noted, however, that in the present invention, the bias compressive stress applying member is not particularly limited as long as the bias compressive stress applying member is capable of applying a stress to the piezoelectric plate. For example, the bias compressive stress applying member may be formed by a spring other than a plate spring, such as a compression coil spring, or an elastic body other than a spring, such as rubber.

This embodiment is directed to the case in which the support body is formed by an elastic member. However, the support body may be formed by a rigid body. In that case as well, as in the above-mentioned embodiment, application of a tensile stress to the piezoelectric plate is prevented. It should be noted, however, that in this case, a stress is not readily applied to the piezoelectric plate 21 via the support body. Accordingly, it is preferable to attach a weight to the bias compressive stress applying member, for example.

Hereinbelow, a different example of a preferred embodiment of the present invention will be described in detail. In the following description, members having functions that are substantially the same as those in the first embodiment mentioned above are denoted by the same symbols, and description thereof is omitted.

Second Embodiment

In this embodiment, a description will be given of an example of a piezoelectric power generator which is suitable for use in cases in which the magnitude of an external stress applied to the piezoelectric power generator changes in both the longitudinal direction Y and the width direction X. Specifically, the piezoelectric power generator according to this embodiment is used as, for example, a mobile phone's backup power supply used together with a main power supply such as a lithium battery, with its surface on the Z1 side of the base portion 11 described later mounted to the heel portion, toe portion, or the like of a shoe sole.

Figure 3:
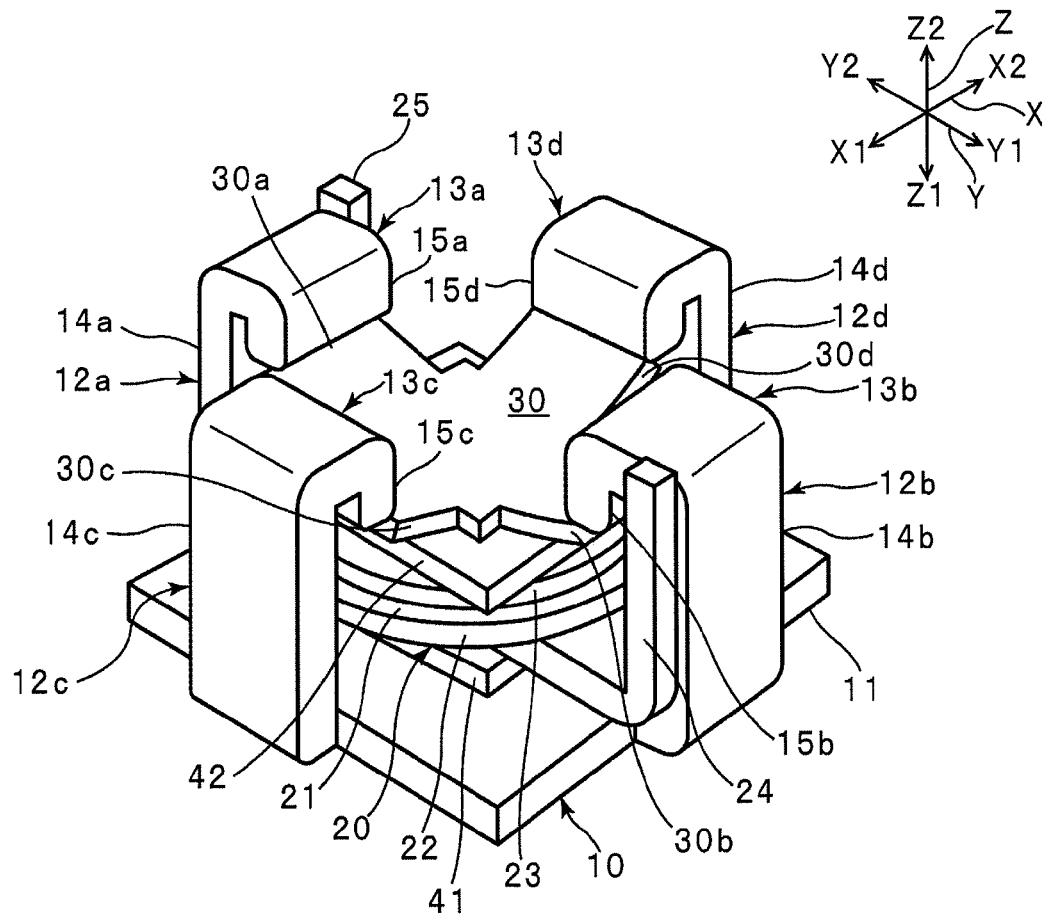
FIG. 3 is a schematic perspective view of a piezoelectric power generator according to a second embodiment as seen diagonally from the side.
Figure 4:
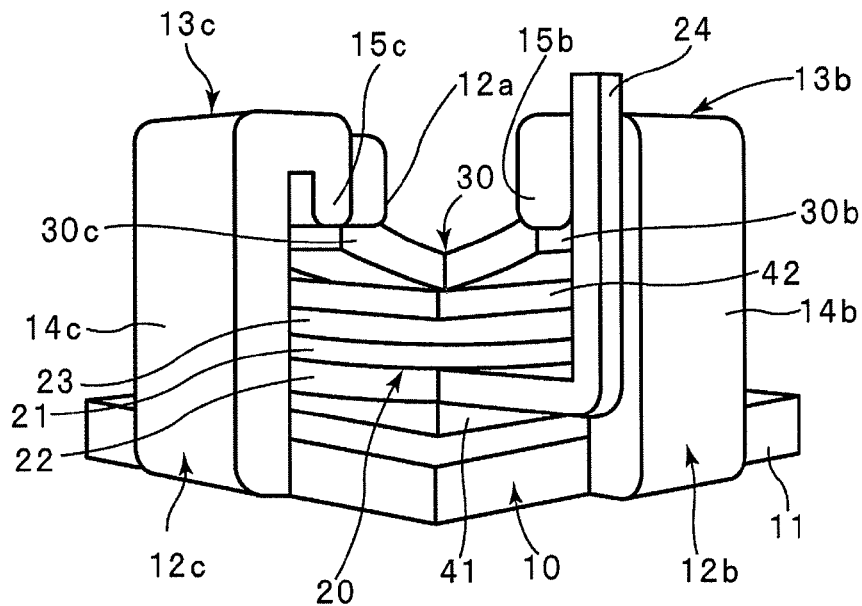
FIG. 4 is a schematic side view of the piezoelectric power generator according to the second embodiment.

FIG. 3 is a schematic perspective view of a piezoelectric power generator according to a second embodiment as seen diagonally from the side. FIG. 4 is a schematic side view of the piezoelectric power generator according to the second embodiment. In this embodiment, the plate spring 30 is supported on the support body 10 at both of its both ends in the longitudinal direction Y, and its both ends in the width direction X that is perpendicular to the longitudinal direction Y. Specifically, the support body 10 includes third and fourth claw portions 12c and 12d, in addition to the first and second claw portions 12a and 12b.

The third claw portion 12c is connected to the end on the X1 side in the width direction X of the base portion 11. On the other hand, the fourth claw portion 12d is connected to the end on the X2 side in the width direction X of the base portion 11. Each of the third and fourth claw portions 12c and 12d extends from the base portion 11 to the Z2 side in the thickness direction Z. In other words, in the thickness direction Z, each of the third and fourth claw portions 12c and 12d extends from the base portion 11 to the piezoelectric element 20 side.

The third and fourth claw portions 12c and 12d respectively include connecting portions 14c and 14d, and engaging portions 13c and 13d. The engaging portions 13c and 13d are respectively connected to the base portion 11 by the connecting portions 14c and 14d. The engaging portions 13c and 13d are respectively provided with projections 15c and 15d that project to the Z1 side. The projections 15c and 15d respectively support the Z2 side of both ends 30c and 30d of the plate spring 30 along the width direction X that is a second direction.

In this way, in this embodiment, the both ends in the longitudinal direction Y of the plate spring 30, and the both ends in the width direction X are both supported by the support body 10. Thus, deformation of the base portion 11 in the longitudinal direction Y and deformation of the base portion 11 in the width direction X can be both efficiently transmitted to the piezoelectric plate 21. From the viewpoint of transmitting both the deformation of the base portion 11 in the longitudinal direction Y and the deformation of the base portion 11 in the width direction X to the piezoelectric plate 21 more efficiently, it is preferable that the plane shapes of the first and second electrodes 22 and 23, and piezoelectric plate 21 be circular.

Third Embodiment

Figure 5:
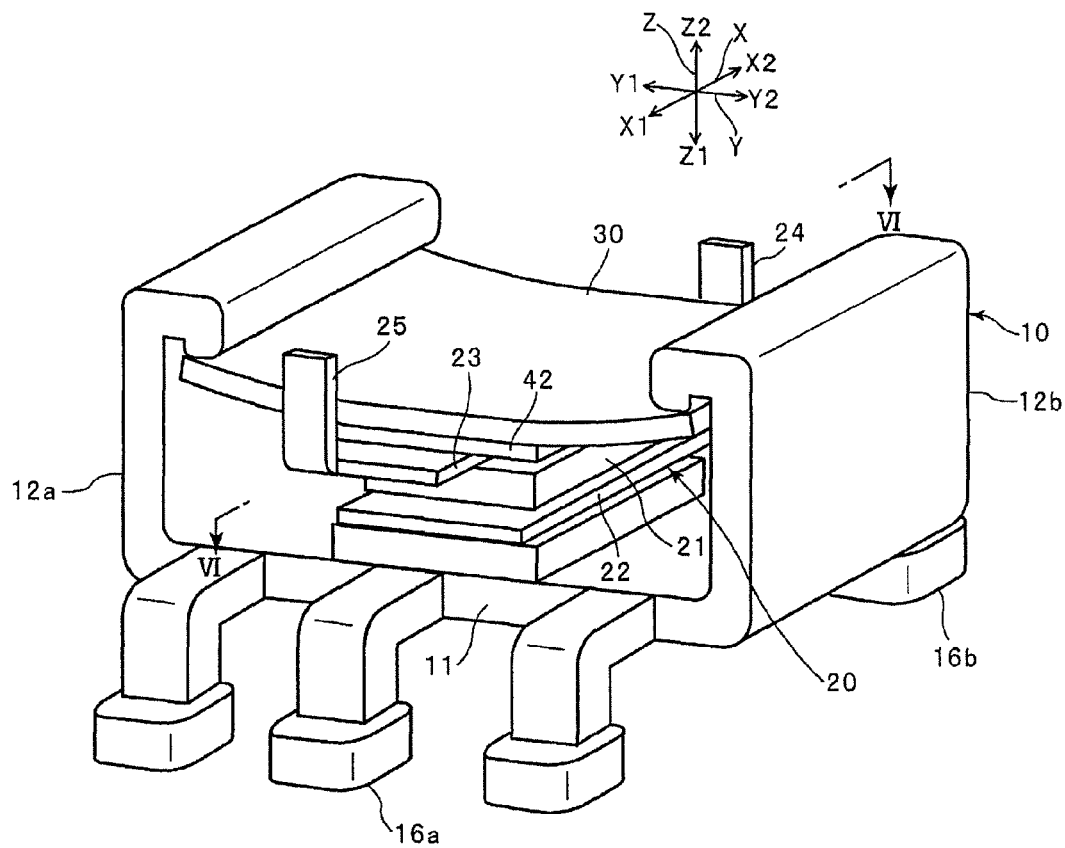
FIG. 5 is a schematic perspective view of a piezoelectric power generator according to a third embodiment as seen diagonally from the side.
Figure 6:
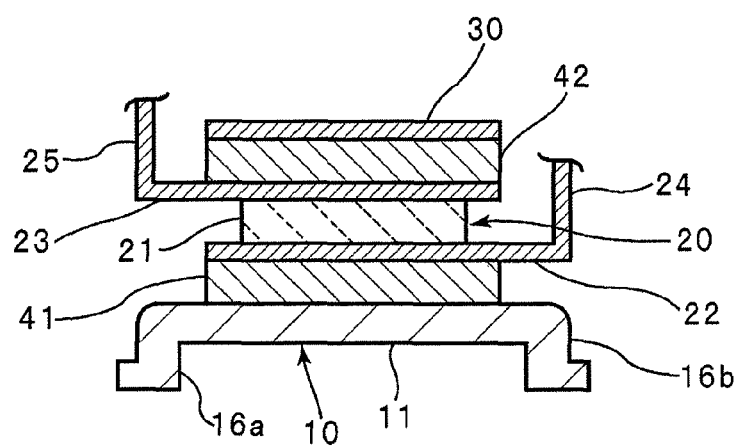
FIG. 6 is a schematic sectional view of the piezoelectric power generator taken along the sectioning line VI-VI shown in FIG. 5.

FIG. 5 is a schematic perspective view of a piezoelectric power generator according to a third embodiment as seen diagonally from the side. FIG. 6 is a schematic sectional view of the piezoelectric power generator taken along the sectioning line VI-VI shown in FIG. 5.

The configuration of the piezoelectric power generator according to this embodiment is the same as that of the piezoelectric power generator according to the first embodiment mentioned above, except for the configuration of the support body. In the piezoelectric power generator according to this embodiment, the support body 10 includes a plurality of pairs of leg portions 16a and 16b, in addition to the base portion 11 and the first and second claw portions 12a and 12b. Specifically, as shown in FIG. 5, the plurality of pairs of leg portions 16a and 16b extend to the side Z1 opposite to the piezoelectric element 20 from each of both ends of the base portion 11 along the width direction X. The leg portions 16a and 16b are fixed to the target mounting member to which the piezoelectric power generator 1 is mounted.

In this way, by providing the leg portions 16a and 16b to the both ends of the base portion 11 along the width direction X, deformation of the target mounting member 9 in the width direction X is absorbed. Consequently, only deformation of the target mounting member 9 in the longitudinal direction Y is transmitted to the base portion 11. Therefore, anisotropy of variation of a compressive stress in the piezoelectric plate 21 can be increased.

Fourth Embodiment

Figure 7:
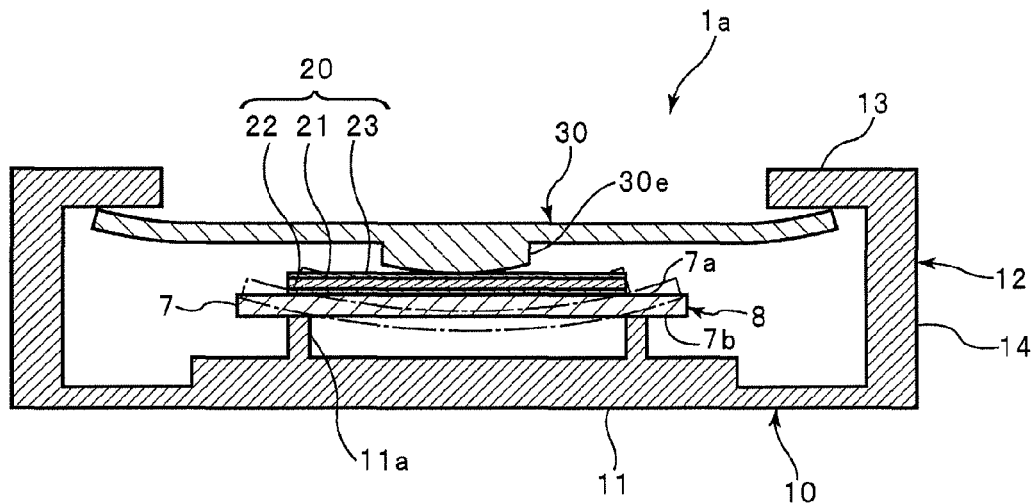
FIG. 7 is a sectional view of a piezoelectric power generator according to a fourth embodiment.
Figure 8:
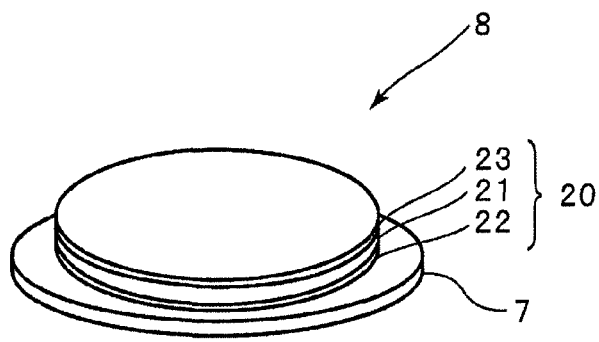
FIG. 8 is a perspective view of a piezoelectric element according to the fourth embodiment.
Figure 9:
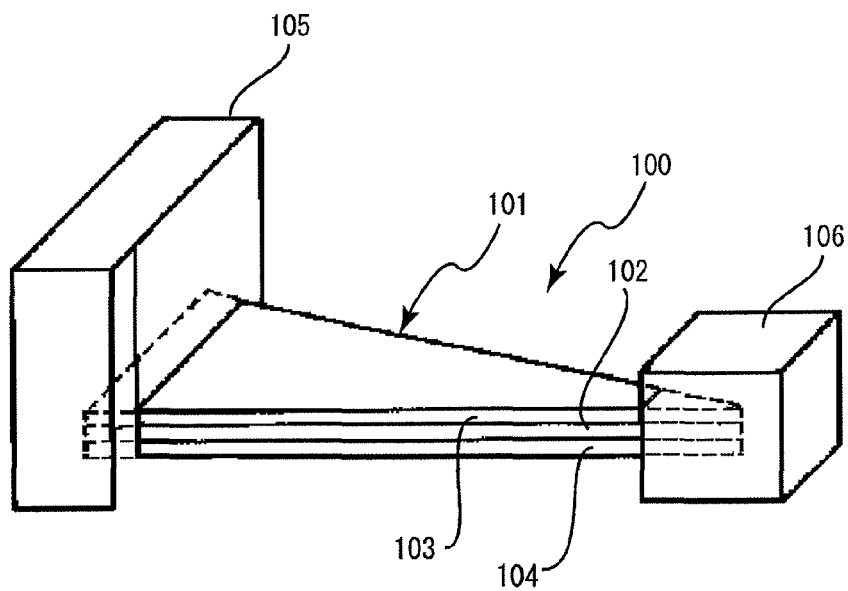
FIG. 9 is a perspective view showing a piezoelectric power generator described in PTL 1.

FIG. 7 is a sectional view of a piezoelectric power generator according to a fourth embodiment. FIG. 8 is a perspective view of a piezoelectric element according to the fourth embodiment. It should be noted that a piezoelectric vibrator plate 8 indicated by the solid line in FIG. 7 represents a state in which the applied bias compressive stress has become small, and the broken line represents the initial state in which the applied bias compressive stress is large.

As shown in FIG. 7, the support body 10 includes the base portion 11. A ring-shaped supporting protrusion 11a is formed in the base portion 11. The periphery of the piezoelectric vibrator 8 is supported by the supporting protrusion 11a.

The piezoelectric vibrator 8 is a so-called unimorph piezoelectric vibrator having the piezoelectric element 20 bonded to only a first principal surface 7a of first and second principal surfaces 7a and 7b of an elastic plate 7. The elastic plate 7 is formed by an appropriate elastic member. The elastic plate 7 can be formed by, for example, a tough high-rigidity ceramic or a metal.

The piezoelectric vibrator 8 is placed in such a way that the elastic plate 7 faces the support body 10 side. The elastic plate 7 side of the peripheral edge of the piezoelectric vibrator 8 is supported by the supporting protrusion 11a. Consequently, the center portion of the piezoelectric vibrator 8 is separated from the support body 10.

The support body 10 includes a ring-shaped claw portion 12 connected to the base portion 11 mentioned above. The claw portion 12 includes a connecting portion 14 formed in a tubular shape, and a ring-shaped engaging portion 13 that extends inwards from the connecting portion 14. The side opposite to the piezoelectric element 20 of the peripheral edge of the plate spring 30 placed on the piezoelectric element 20 side of the piezoelectric vibrator 8 is engaged by the engaging portion 13 of the support body 10.

A projection 30e extending to the piezoelectric vibrator 8 side is formed at substantially the center portion of the plate spring 30. The portion of the piezoelectric vibrator 8 located closer to the center portion than the portion supported by the support body 10 is pressed to the support body 10 side by the projection 30e.

In a piezoelectric power generator 1a according to this embodiment, when vibration or stress is exerted on the piezoelectric power generator 1a, the magnitude of a bias compressive stress applied to the piezoelectric element 20 by the plate spring 30 changes due to deformation of the support body 10 or the self-weight of the plate spring 30. As a result, the magnitude of a compressive stress in the piezoelectric plate 21 changes, and electric power is generated due to the piezoelectric effect.

In this embodiment as well, application of a tensile stress to the piezoelectric plate 21 is effectively prevented by the plate spring 30. Therefore, it is possible to effectively prevent cracking from occurring in the piezoelectric plate 21. As a result, high durability can be achieved.

In this embodiment, since a space is formed above and below the center portion of the piezoelectric vibrator 8, the piezoelectric vibrator 8 can be made to vibrate greatly. Therefore, high power generation efficiency can be achieved.

In this embodiment, the plane shapes of the elastic plate 7, piezoelectric plate 21, and first and second electrodes 22 and 23 are circular. Therefore, the efficiency of vibration of the piezoelectric vibrator 8 is enhanced, thereby making it possible to achieve enhanced power generation efficiency.

| Reference Number List | |
|---|---|
| 1, 1a | piezoelectric power generator |
| 7 | elastic plate |
| 7a | first principal surface of elastic plate |
| 7b | second principal surface of elastic plate |
| 8 | piezoelectric vibrator |
| 9 | target mounting member |
| 10 | support body |
| 11 | base portion |
| 11a | supporting protrusion |
| 12 | claw portion |
| 12a | first claw portion |
| 12b | second claw portion |
| 12c | third claw portion |
| 12d | fourth claw portion |
| 13, 13a to 13d | engaging portion |
| 14, 14a to 14d | connecting portion |
| 15a to 15d | projection |
| 16a, 16b | leg portion |
| 20 | piezoelectric element |
| 21 | piezoelectric plate |
| 21a | first principal surface of piezoelectric plate |
| 21b | second principal surface of piezoelectric plate |
| 22 | first electrode |
| 23 | second electrode |
| 24, 25 | terminal electrode |
| 30 | plate spring |
| 30a to 30d | end of plate spring |
| 30e | projection |
| 41 | first cushioning member |
| 42 | second cushioning member |

The invention claimed is:

1. A piezoelectric power generator, comprising:
a support body;
a piezoelectric element on the support body, the piezoelectric element having a piezoelectric plate polarized in a thickness direction, and first and second electrodes each on a surface of the piezoelectric plate; and
a bias compressive stress applying member that is supported by the support body such that the piezoelectric element is between the bias compressive stress applying member and the support body, and that applies to the piezoelectric element a bias compressive stress acting in the thickness direction of the piezoelectric plate so that a magnitude of a compressive stress in the piezoelectric plate changes with a change in stress applied to the piezoelectric power generator.

2. The piezoelectric power generator according to claim 1, wherein the support body is an elastic body.

3. The piezoelectric power generator according to claim 1, wherein the first and second electrodes are located on opposed surfaces of the piezoelectric plate.

4. The piezoelectric power generator according to claim 1, wherein the bias compressive stress applying member is a spring.

5. The piezoelectric power generator according to claim 4, wherein the bias compressive stress applying member is a plate spring, and first opposed ends of the plate spring in a first direction along a plane direction of the plate spring are supported by the support body.

6. The piezoelectric power generator according to claim 5, wherein the bias compressive stress applying member is shaped to be convex relative to a side thereof adjacent the piezoelectric element.

7. The piezoelectric power generator according to claim 5, wherein second opposed ends of the plate spring in a second direction along the plane direction of the plate spring are further supported by the support body.

8. The piezoelectric power generator according to claim 5, wherein the support body is an elastic body, has a support portion that supports the piezoelectric element, and a leg portion that extends to a side opposite to the piezoelectric element from each of both ends along a second direction of the support portion.

9. The piezoelectric power generator according to claim 7, wherein the second direction is perpendicular to the first direction.

10. The piezoelectric power generator according to claim 1, further comprising:
a piezoelectric vibrator of a unimorph type having an elastic plate, the elastic plate having first and second principal surfaces that are opposite to each other and having the piezoelectric element bonded to only the first principal surface,
wherein the support body supports the elastic plate so that a center portion of the piezoelectric vibrator is separated from the support body.

11. The piezoelectric power generator according to claim 10, wherein the bias compressive stress applying member applies the bias compressive stress to a center portion of the piezoelectric vibrator.

12. The piezoelectric power generator according to claim 10, wherein a plane shape of the piezoelectric plate is circular.

13. The piezoelectric power generator according to claim 12, wherein a plane shape of the elastic plate is circular.

14. The piezoelectric power generator according to claim 1, further comprising a cushioning member located at least one of between the support body and the piezoelectric element, and between the piezoelectric element and the bias compressive stress applying member.

15. The piezoelectric power generator according to claim 1, further comprising:
   a first cushioning member located between the support body and the piezoelectric element; and
   a second cushioning member located between the piezoelectric element and the bias compressive stress applying member.

* * * * *